US009648434B1

(12) United States Patent
Miehl et al.

(10) Patent No.: US 9,648,434 B1

(45) Date of Patent: May 9, 2017

(54) MICROPHONE PORTING STRUCTURE AND ASSEMBLY FOR A COMMUNICATION DEVICE

(71) Applicant: MOTOROLA SOLUTIONS, INC, Schaumburg, IL (US)

(72) Inventors: Andrew P. Miehl, Boca Raton, FL (US); Patrick S. Claeys, Pembroke Pines, FL (US); Karl F. Mueller, Sunrise, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 14/885,928

(22) Filed: Oct. 16, 2015

(51) Int. Cl.

*H04R 9/08* (2006.01)
*H04R 31/00* (2006.01)
*B81B 7/00* (2006.01)

(52) U.S. Cl.

CPC ......... *H04R 31/006* (2013.01); *B81B 7/0061* (2013.01); *B81B 2201/0257* (2013.01); *H04R 2201/003* (2013.01)

(58) Field of Classification Search

USPC .......................................................... 381/355

See application file for complete search history.

(56) References Cited

U.S. PATENT DOCUMENTS

| | | | | | |
|---|---|---|---|---|---|
| 8,284,966 | B2 | 10/2012 | Wilk et al. | | |
| 8,553,920 | B2 * | 10/2013 | Feiertag | B81B 7/0077 | 381/175 |
| 8,861,764 | B2 * | 10/2014 | Tanaka | H04R 1/38 | 381/355 |
| 2010/0086146 | A1 * | 4/2010 | Gong | B81C 1/0023 | 381/91 |

* cited by examiner

*Primary Examiner* — Amir Etesam

(74) *Attorney, Agent, or Firm* — Barbara R. Doutre

(57) ABSTRACT

A microphone porting structure, comprises a substrate (312) having a bearing surface and a porting through-hole (344) formed therethough for aligning with a microphone port of a bottom ported microphone (334). The bearing surface provides an area against which to seal and the through-hole provides for acoustic path alignment for the audio ports of paired bottom ported microphones mounted to a printed circuit board.

11 Claims, 5 Drawing Sheets

200

300

MICROPHONE PORTING STRUCTURE AND ASSEMBLY FOR A COMMUNICATION DEVICE

FIELD OF THE INVENTION

The present invention relates generally to microphone porting and more particularly microphone porting in communication devices.

BACKGROUND

Today's portable communication devices, operated in a public safety environment, often utilize a plurality of microphones for noise cancellation of background noise. Some microphone arrangements also need to be mounted in pairs to provide beam forming (directivity to source/user). Unlike sealing and porting needs of a singular microphone, the porting and sealing of a plurality of microphones face different acoustical problems and physical implementation challenges. Product use requirements, in combination with the technical requirements of noise canceling algorithms, require that microphones be properly positioned with respect to each other.

Some microphone array arrangements are challenged with alignment between microphones in the z-direction (thickness of the product), such as in handheld radio applications where the device is held away but facing the user. FIG. 1 is a microphone porting structure 100 in accordance with the prior art. While the porting structure 100 provides space saving for top ported microphones 102, 104 mounted to a printed circuit board (pcb) 106 and establishes a noise cancelling vector that is normal to the pcb, however the outward porting makes these devices difficult to seal and the acoustic performance tradeoffs associated with top ported microphones makes them undesirable, particularly for beam forming applications.

Accordingly, there is a need for improved microphone porting. Improved microphone porting that would further facilitate the ability to seal the microphone in a portable communication device would be a further desired benefit.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in a microphone porting structure and a microphone mounting assembly for porting bottom ported microphone pairs mounted to a printed circuit board of a communication device. The use of the structure in the porting of microphone pairs improves the ability to integrate a large number of microphones within tight space constraints and facilitates the sealing of the microphones.

Bottom ported micro-electromechanical (MEMS) microphones can be used in a variety of communication products, both consumer and commercial products, and acoustic sealing and placement of such devices impacts performance. The use of bottom ported MEMS microphones is sometimes considered a constraint or requirement for the type of microphone used in certain products, such as the public safety products. Product use case requirements, in combination with technical requirements of noise cancelling algorithms, particularly beam forming algorithms, often dictate the positioning of microphones with respect to each other. However, the physical real estate is often limited and the required porting of microphone pairs can become problematic.

Additionally, ruggedized communication devices, such as public safety radios and their accessories, require that the microphones be sealed with a breathable, waterproof membrane. All of these necessary physical traits for a waterproof noise cancelling microphone system that uses bottom ported microphones present serious challenges in achieving appropriate porting.

Figure 1:
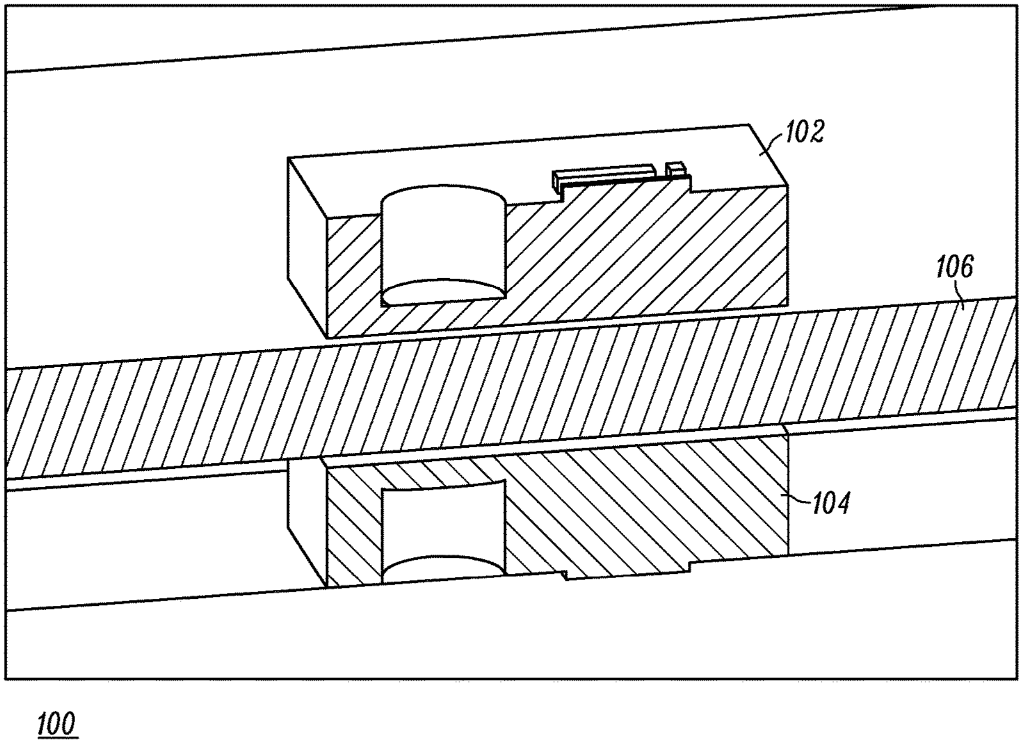
FIG. 1 is a prior art microphone mounting assembly in accordance with the prior art.
Figure 2:
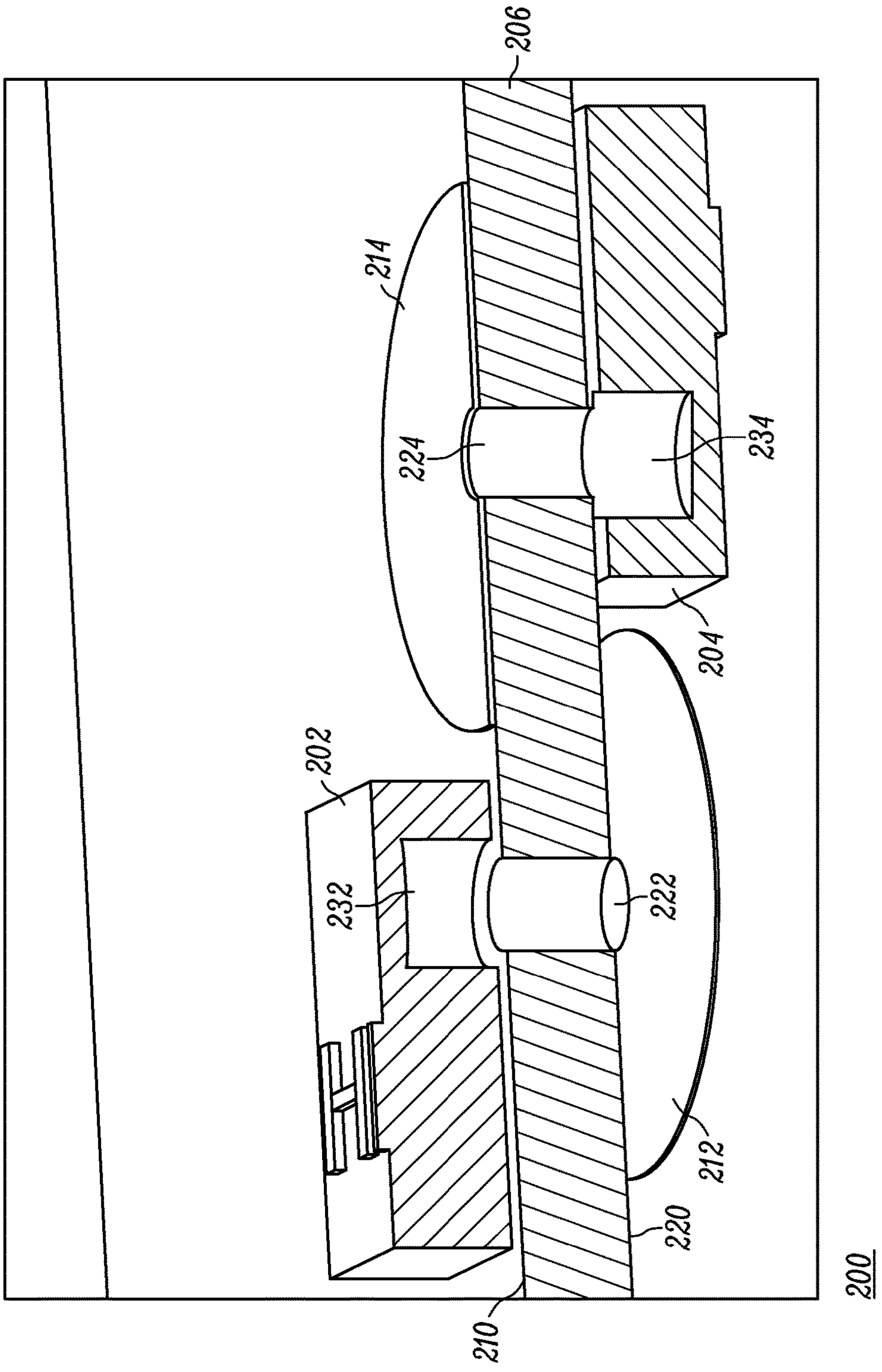
FIG. 2 is a partial cut-away of a microphone mounting assembly distance problems.

FIG. 2 is a partial cut-away view of a microphone mounting assembly 200 illustrating an example of pre-established spacing requirement challenges faced by some products. The microphone mounting assembly 200 comprises a printed circuit board (pcb) 206 having an upper surface 210 and a lower surface 220. A first acoustic port 222 passes through the upper and lower surfaces 210, 220 of the pcb 206, and a second acoustic port 224 passing through the upper and lower surfaces 210, 220 of the pcb 206. The distance between the first and second acoustic ports 222, 224 of the pcb 206 has been pre-established by design restrictions establishing keep out areas. To bring the bottom mounted microphone components 202, 204 any closer together from this point in order to improve alignment to the vector that is normal to the pcb surface would result in violation of the sealing requirement. At best, a seal 212, 214 can be placed as shown. The embodiments to be described herein are directed to a microphone porting structure that will allow the bottom ported microphones to be brought closer together by providing an improved acoustic path and an improved ability to seal.

Accordingly, the components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Figure 3:
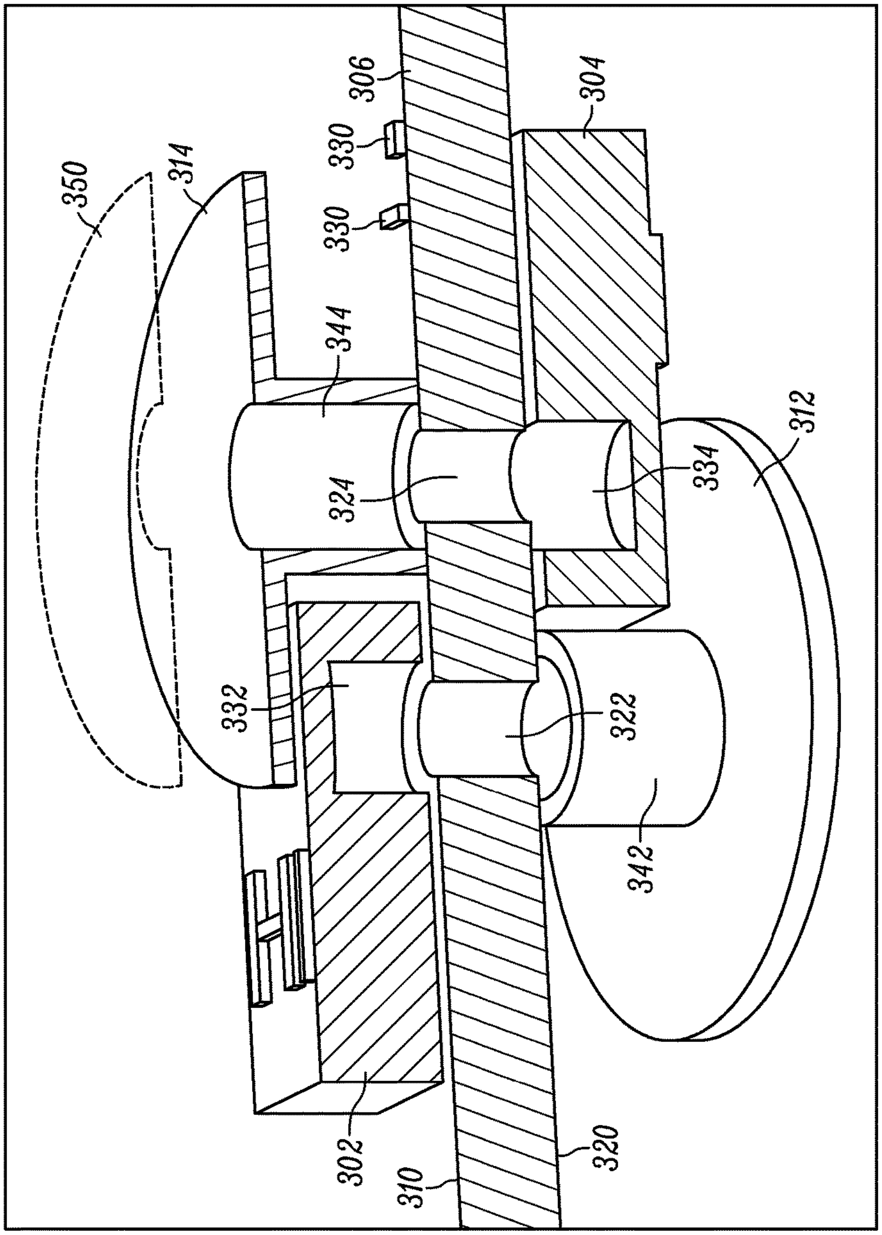
FIG. 3 is a partial cut-away of a microphone mounting assembly having microphone porting structures formed in accordance with another embodiment.

Briefly, in accordance with the various embodiments, there is described herein a microphone porting structure for a bottom ported surface mount microphone comprising a substrate having a planar, bearing surface and a porting through-hole formed therethrough. The substrate formed in accordance with the various embodiments comprises a predetermined thickness with the planar, bearing surface with the through-hole that facilitates acoustic porting and sealing. The sealing may be acoustical sealing, environmental sealing and/or sealing for assembly tolerances. For example, the substrate may be formed of plastic, metal, or pcb (FR4) having predetermined thickness with a straight porting through-hole. In other embodiments, the substrate may be formed such that the planar bearing surface is raised atop of the porting through-hole by a certain distance, leaving room for components underneath, and the through-hole is surface mountable. In other embodiments, the substrate may be formed to have a planar surface having a predetermined thickness within which is formed a bent porting through-hole for adjusting porting alignment. All of these embodiments provide a means for reliable sealing while allowing for tighter microphone spacing and will be shown FIG. 3 is a partial cut-away of a microphone mounting assembly 300 having microphone porting structures 312, 314 formed in accordance with an embodiment. In this embodiment, a maximum printed circuit board "greenspace" savings is achieved by the microphones being closer together through the use of broad, planar surface microphone porting structures 312, 314. Each microphone porting structure 312, 314 formed in accordance with the embodiment provides a large bearing surface that can advantageously be used to seal against and can thus provides both environmental sealing and absorption of assembly and system tolerances. In accordance with the embodiments, each seal is established above the body of the opposing microphone.

In accordance with this embodiment, the microphone mounting assembly 300 comprises a printed circuit board (pcb) 306 having upper and lower surfaces 310, 320. A first acoustic port 322 passes through the upper and lower surfaces 310, 320 of the pcb 306, and a second acoustic port 324 passes through the upper and lower surfaces 310, 220 of the pcb 306. A first bottom ported microphone 302 having a first bottom microphone port 332 is mounted to the upper surface 310 of the pcb 306 in alignment with the first acoustic port 322 of pcb 306. A second bottom ported microphone 304 having a second bottom microphone port 334 is mounted to the lower surface 320 of pcb 306 in alignment with the second acoustic port 324 of pcb 306. The microphones may be, for example, bottom ported miniature surface mount (SMT) microphones.

In accordance with this embodiment, a first microphone porting structure 312 is mounted to the lower surface 320 of the pcb 306, and a second acoustic porting structure 314 is mounted to the upper surface 310 of the pcb 306. The second bottom ported microphone 304 having the second bottom microphone port 334 is aligned with the second acoustic port 324 of the pcb 306 and the second acoustic porting structure 314. The first bottom ported microphone 302 is mounted to the upper surface 310 of the pcb 306, and the first bottom ported microphone 302 having a first bottom port 332 is aligned with the first acoustic port 322 of the pcb 306 and the first microphone porting structure 312.

In this embodiment the first microphone porting structure 312 is raised at throughole 342, and the second acoustic porting structure is raised and throughole 344, forming an umbrella area of space. The umbrella area provides the space necessary to move microphones closer together while still creating bearing surfaces for seals, such as seal 350. The additional space below the planar surface of structures 312 and 314, provides room for components, for example components 330, to be mounted to the pcb 306. In accordance with the various embodiments, by providing room for the opposing microphone, the alignment of the acoustic ports to the pcb normal vector can be improved.

The microphone mounting assembly 300 using microphone porting structures 312, 314 for aligning bottom ported microphones 302, 304 allows the microphones to be brought closer together in the plane of a printed circuit board (pcb) 306, and provides for a broad, planar sealing surface to be established above the body of the opposing microphone. The microphone mounting assembly can be accurately placed using automated pick and place machines, thereby significantly reducing the assembly tolerance between the structures 312, 314 and the adjacent microphone body 302, 304.

The more alignment there is of the microphones themselves to the vector that is normal to the pcb surface, the fewer lateral downstream structures are needed to realign the external sound sampling points. Any lateral acoustic porting that does not directly extend to the outer surface of the communication device is additional acoustic port length that can serve to lower the Helmholtz resonance of the acoustic porting system, potentially bringing it into the use case frequency band, adversely affecting the microphone performance.

Figure 4:
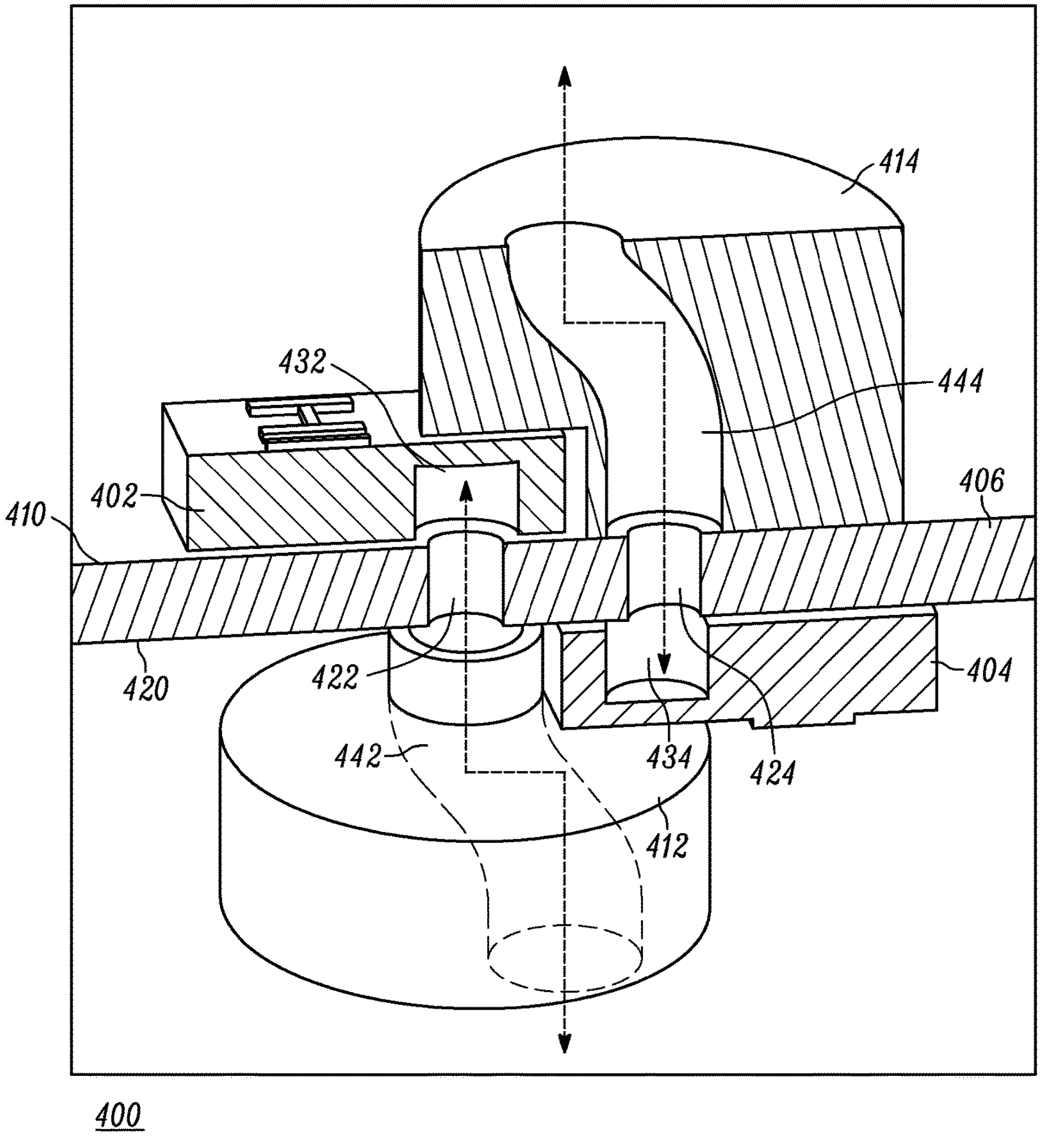
FIG. 4 is a partial cut-away of a microphone mounting assembly having microphone porting structures formed in accordance with another embodiment.

FIG. 4 is a partial cut-away of a microphone mounting assembly having microphone porting structures 412, 414 formed in accordance with another embodiment. This embodiment provides for further alignment correction of the porting of microphone pairs in accordance with another embodiment. In this case, the structure is configured to both improve alignment of the microphone bodies 402, 404 as much as possible and redirect the acoustic port such that perfect alignment of the acoustically active ports to the pcb 406 normal vector is achieved. In this embodiment the substrate has a predetermined thickness and the through-hole integrated therein is bent. In this embodiment the first microphone porting structure 412 has a first bent through-hole 442 formed therein, and second microphone porting structure 414 has a second bent through-hole 444 formed therein. The first microphone porting structure 412 fits at least partially over a second bottom-ported, surface mounted (SMT) miniature microphone that is mounted on a lower surface 420 of a pcb 406. A second microphone porting structure 414 fits at least partially over a first bottom-ported, SMT miniature microphone 402 that is mounted on an upper surface of the pcb 406. The alignment of the microphone porting structure 412 with the pcb acoustic port 422, and the alignment of the microphone porting structure 414 with the pcb acoustic port 424—in conjunction with the bent through-holes 442, 444 provide for back to back audio alignment of the audio porting.

In this embodiment, a more filled in structure can be used to accommodate the bent porting, as opposed to the umbrella structure, such as formed of molded plastic. The sealing on this type of structure can be more three-dimensional if desired (i.e. planar on top like 350 and then extending down the body of the microphone porting structure).

Hence, perfect alignment of the microphone's acoustically active ports 432, 434 to the pcb 406 normal vector is achieved through the use of the microphone porting structures 412, 414. Each structure is easy to manufacture and easy to pick and place on a circuit board. This configuration is of particular benefit in the context of ultrathin communication devices where there is very little product thickness/depth that might be exploited by other lateral structures to recover from bottom port microphone body misalignment.

Figure 5A:
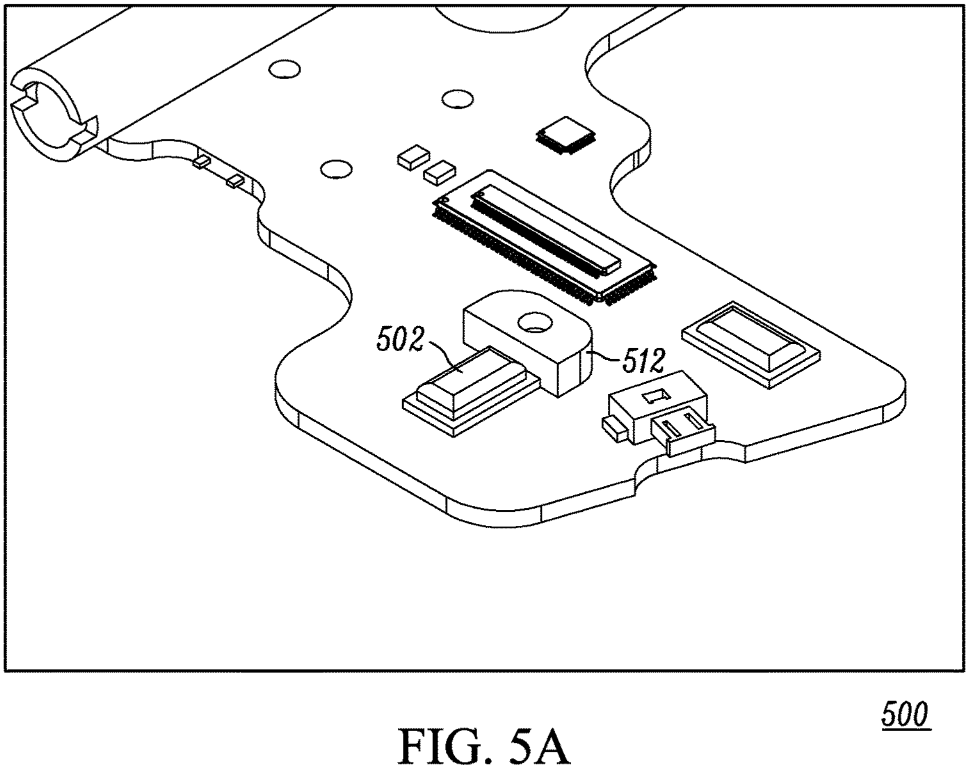
FIGS. 5A and 5B are isometric views of printed circuit boards having the microphone porting structures formed in accordance with an embodiment in a communication device.
Figure 5B:
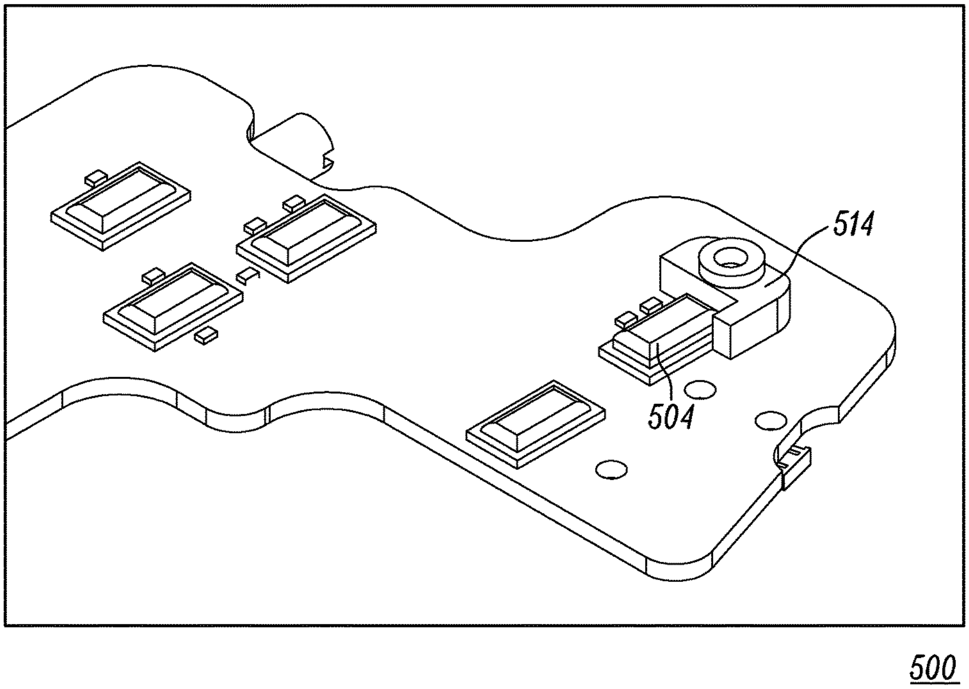

FIGS. 5A and 5B show printed circuit board 502 from opposing sides having the microphone porting structures formed in accordance with an embodiment in a communication device. View 500 shows bottom ported microphone 502 and microphone porting structure 512. View 540 shows bottom ported microphone 504 and microphone porting structure 514. Microphone porting structure 512 provides porting for bottom ported microphone 504. Microphone porting structure 514 provides porting for bottom ported microphone 502. The bearing surface is shown on each microphone porting structure 512, 514 which provides a surface upon which to seal. This embodiment has the bent porting within each microphone porting structure.

Thus, the various embodiments have provided for a microphone porting structure that provides improved porting for bottom ported microphones. The substrate having a planar bearing surface and a porting through-hole formed therethough, allow for aligning the microphone port of the bottom ported microphone closer to another microphone port of paired microphones. The bearing surface provides a surface against which to seal and the through-hole provides an acoustic path for a bottom ported microphone.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A microphone mounting assembly, comprising:

a printed circuit board (pcb) having an upper and lower surfaces;

a first microphone porting structure mounted to the upper surface of the pcb;

a second microphone porting structure mounted to the lower surface of the pcb;

a first acoustic port passing through the upper and lower surfaces of the pcb;

a second acoustic port passing through the upper and lower surfaces of the pcb;

a first bottom ported microphone mounted to the lower surface of the pcb, the first bottom ported microphone having a first bottom port aligned with the first acoustic port of the pcb and the first microphone porting structure; and a second bottom ported microphone mounted to the upper surface of the pcb, the second bottom ported microphone having a second bottom port aligned with the second acoustic port of the pcb and the second microphone porting structure; and wherein the first microphone porting structure has a broad planar surface that overlaps at least partially over the second bottom ported microphone.

2. The microphone mounting assembly of claim 1, wherein the second microphone porting structure has a bearing surface that overlaps at least partially over the first bottom ported microphone mounted to the lower surface of the pcb.

3. The microphone mounting assembly of claim 1, wherein the substrate has a predetermined thickness with a straight through-hole.

4. The microphone mounting assembly of claim 1, wherein the bearing surface is raised atop of the through-hole and the through-hole is surface mountable.

5. The microphone mounting assembly of claim 1, wherein the substrate has a predetermined thickness and the through-hole integrated therein is bent.

6. The microphone mounting assembly of claim 1, wherein the substrate is a surface mount substrate.

7. The microphone mounting assembly of claim 1, wherein the substrate is formed of plastic, metal or printed circuit board material.

8. The microphone mounting assembly, of claim 1, wherein the first and second microphone porting structures provide room for opposing first and second bottom ported microphones to be closer together.

9. A microphone mounting assembly, comprising:

a first microphone porting structure fitting at least partially over a second, bottom-ported, surface mounted (SMT) miniature microphone that is mounted on an upper surface of a printed circuit board (pcb);

a second microphone porting structure fitting at least partially over a first bottom-ported, SMT miniature microphone that is mounted on a lower surface of the pcb; and a first seal coupled over the first planar surface above the first microphone porting structure and the second bottom-ported SMT, miniature microphone; and a second seal coupled over the second planar surface above the second microphone porting structure and the first bottom-ported, SMT miniature microphone.

10. The microphone mounting assembly, of claim 9, wherein spacing requirements limit microphone placement on the pcb.

11. The microphone mounting assembly, of claim 9, wherein the first and second microphone porting structures provide room for opposing first and second microphones to be closer together.

* * * * *